US008782522B2

(12) United States Patent  (10) Patent No.: US 8,782,522 B2
Nakanishi et al.  (45) Date of Patent: Jul. 15, 2014

(54) VIDEO DISPLAY DEVICE AND MENU SCREEN DISPLAY METHOD

(75) Inventors: Akira Nakanishi, Tokyo (JP); Hideyuki Toma, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/313,824

(22) Filed: Dec. 7, 2011

(65) Prior Publication Data

US 2012/0226982 A1 Sep. 6, 2012

(30) Foreign Application Priority Data

Mar. 1, 2011 (JP) ................................. 2011-044369

(51) Int. Cl.
G06F 3/048 (2013.01)
(52) U.S. Cl.
USPC ......................................................... 715/719
(58) Field of Classification Search
USPC ................................... 715/719, 764; 707/764
See application file for complete search history.

(56) References Cited

U.S. PATENT DOCUMENTS

| 6,154,750 | A  | * | 11/2000 | Roberge et al. ........................ 1/1 |
| 2003/0064757 | A1 | * | 4/2003 | Yamadera et al. ............ 455/566 |
| 2004/0028375 | A1 | * | 2/2004 | Kim et al. ........................ 386/46 |
| 2004/0070594 | A1 | * | 4/2004 | Burke ............................ 345/716 |
| 2004/0255325 | A1 | * | 12/2004 | Furui et al. ....................... 725/61 |
| 2007/0245264 | A1 | * | 10/2007 | Hoerentrup et al. .......... 715/835 |
| 2009/0271823 | A1 |   | 10/2009 | Jung et al. |

FOREIGN PATENT DOCUMENTS

| JP | 11-73259 | 3/1999 |
| JP | 2004-312447 | 11/2004 |
| JP | 2005-006042 | 1/2005 |
| JP | 2007-251482 | 9/2007 |
| JP | 2008-059465 | 3/2008 |
| JP | 2008-217322 | 9/2008 |
| JP | 2009-015440 | 1/2009 |
| JP | 2009-268101 | 11/2009 |
| JP | 2010-061348 | 3/2010 |
| JP | 2010-193533 | 9/2010 |
| JP | 2010-225018 | 10/2010 |

OTHER PUBLICATIONS

Japanese Patent Application No. 2011-044369, Decision of Rejection, mailed Oct. 2, 2012, (with English Translation).
Japanese Patent Application No. 2011-044369, Notice of Rejection, mailed May 8, 2012, (with English Translation).
Japanese Patent Application No. 2012-263389, Decision to Grant a Patent, mailed Feb. 12, 2013, (with English Translation).

* cited by examiner

*Primary Examiner* — William Bashore
*Assistant Examiner* — Rayeez Chowdhury
(74) *Attorney, Agent, or Firm* — Blakely, Sokoloff, Taylor & Zafman LLP

(57) ABSTRACT

According to one embodiment, a video display device includes a menu screen display module. The menu screen display module displays a menu screen. The menu screen includes at least two hierarchical levels. A higher hierarchical level includes a first group formed by arranging select elements representing classifications of various functions related to video image displaying. A lower hierarchical level includes a second group formed by arranging select elements representing the functions. Upon receipt of a signal from a direct key to which one of the classifications represented by the select elements of the higher hierarchical level is assigned, the menu screen display module displays the menu screen in a state in which one of the select elements is selected. Here, the one of the select elements represents the one of the classifications to which the direct key is assigned, and the operation device includes the direct key.

17 Claims, 15 Drawing Sheets

FIG.7

| FIRST HIERARCHICAL LEVEL (IA) | SECOND HIERARCHICAL LEVEL (IB) |
|---|---|
| BROADBAND | ☐ YEE-HA JAPAN |
| | ☐ DOOR |
| | ☐ HIKARI TV |
| | ☐ TATSUYA TV |
| | ☐ A's TV |
| | ☐ Tube |
| | ☐ INTERNET |
| RECORD | ☐ PROGRAM LISTING |
| | ☐ PROGRAM LISTING SUMMARY |
| | ☐ PROGRAM SEARCH |
| | ☐ RECOMMENDED SERVICES |
| | ☐ QUICK RECORD |
| | ☐ SCHEDULE LIST |
| VIEW | ☐ RECORDING LIST |
| | ☐ PROGRAM LISTING |
| | ☐ PROGRAM LISTING SUMMARY |
| | ☐ FLASH NEWS |
| MEDIA PLAYER | ☐ VIDEO |
| | ☐ PHOTO |
| | ☐ MUSIC |
| INPUT SWITCH | ☐ BROADCAST |
| | ☐ HDMI 1 |
| | ☐ HDMI 2 |
| | ☐ HDMI 3 |
| | ☐ HDMI 4 |
| | ☐ VIDEO 1 |
| | ☐ VIDEO 2 |

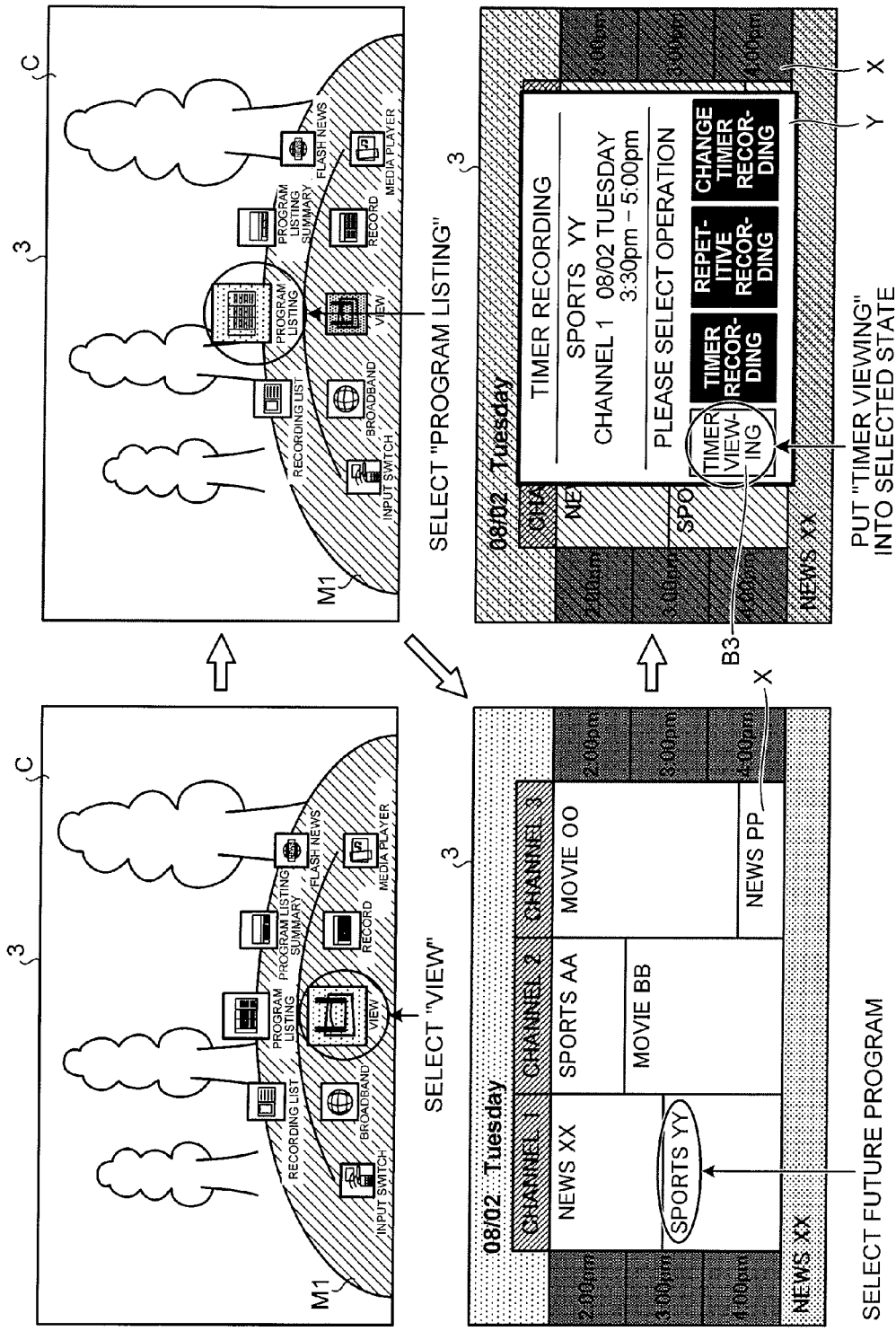

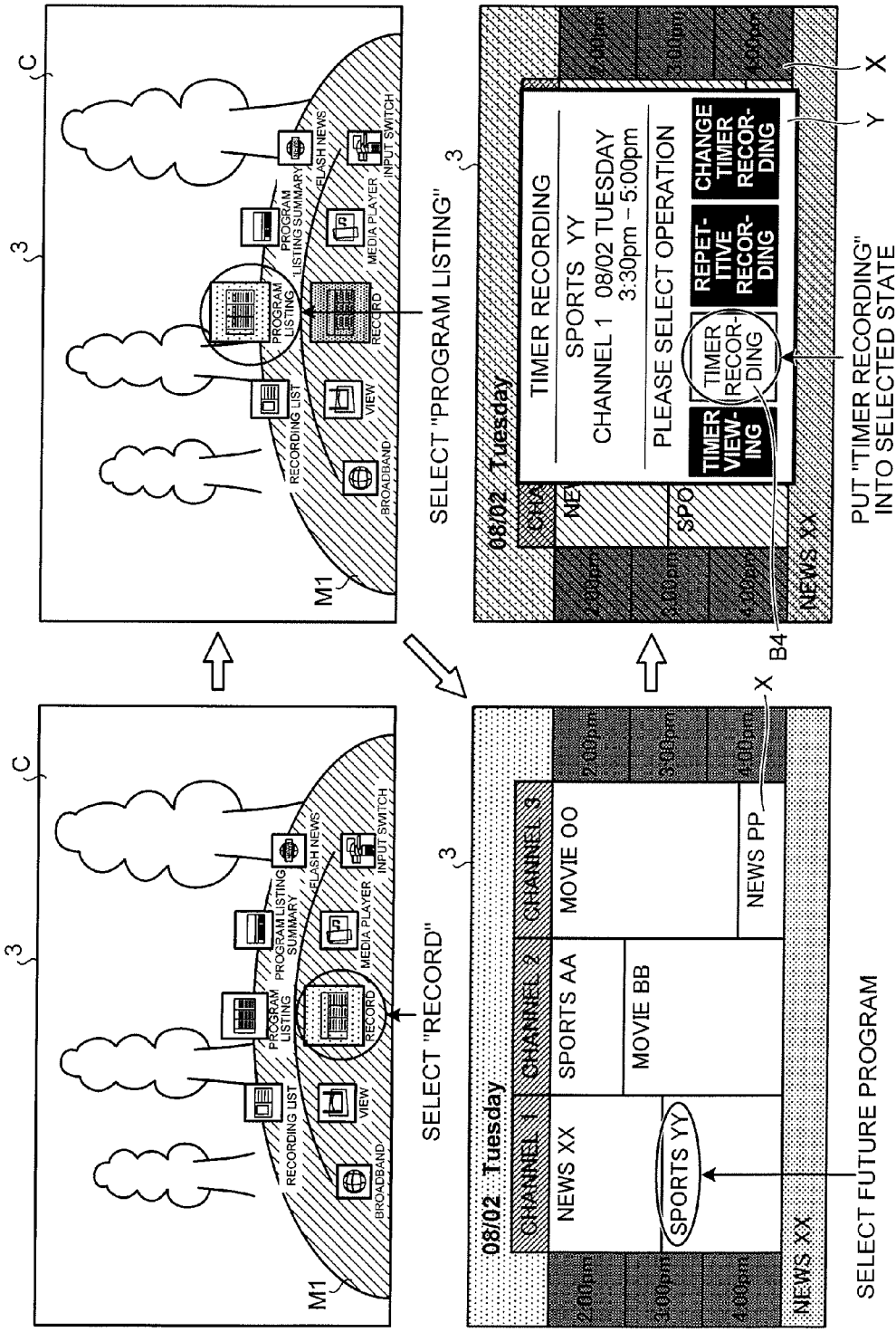

VIDEO DISPLAY DEVICE AND MENU SCREEN DISPLAY METHOD

CROSS-REFERENCE TO RELATED APPLICATIONS

This application is based upon and claims the benefit of priority from Japanese Patent Application No. 2011-044369, filed Mar. 1, 2011, the entire contents of which are incorporated herein by reference.

FIELD

Embodiments described herein relate generally to a video display device and a menu screen display method.

BACKGROUND

In recent years, video display devices (such as digital televisions) have increasingly become multifunctional and highly-sophisticated, and become capable of being provided with various kinds of audio and visual (AV) functions. For example, in addition to the viewing, recording and reproducing functions of television broadcast programs, it becomes possible to realize various other AV functions including: a function to store content such as video images and music in an internal/external large-capacity recording medium, and to read and reproduce the content; and a function to reproduce video images or music programs provided over a network.

In some of the video display devices involving such various functions, as one kind of user interface function, a menu screen displaying a list of various functions is displayed to require the user to select a desired function.

Meanwhile, as a technique for improving the user friendliness of such a user interface function, there exists a technique for changing shapes/display colors of icons, a technique for assigning functions to a direct key or a plurality of keys, or the like.

In a video display device that can have various functions such as the above described various AV functions, a user interface function is required so that a user can easily select a desired function from the various functions, through a simple operation.

In a video display device with more functions and higher performance, a large number of direct keys need to be provided to the remote controller that operates the video display device from a distance. Further, operation of the remote controller also becomes complicated. However, if the direct keys are eliminated, users who are used to the conventional direct key operations need to relearn how to use the remote controller from the beginning, and extra time and energy will be required.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIG. 7 is an exemplary diagram illustrating a relationship between a menu classification icon group and a menu icon group in the embodiment;

FIG. 15 is an exemplary schematic diagram illustrating still another transition in the embodiment; and FIG. 16 is an exemplary schematic diagram illustrating still another transition in the embodiment.

DETAILED DESCRIPTION

In general, according to one embodiment, a video display device comprises a menu screen display module. The menu screen display module displays a menu screen from which a select element representing a desired function can be selected by a key operation on an operation device. The menu screen comprises at least two hierarchical levels. A higher hierarchical level of the hierarchical levels comprises a first group formed by arranging select elements representing classifications of various functions related to video image displaying. A lower hierarchical level of the hierarchical levels comprises a second group formed by arranging select elements representing the functions corresponding to the classifications. Upon receipt of a signal from a direct key to which one of the classifications represented by the select elements of the higher hierarchical level is assigned, the menu screen display module displays the menu screen in a state in which one of the select elements is selected. Here, the one of the select elements represents the one of the classifications to which the direct key is assigned, and the operation device comprises the direct key.

Figure 1:
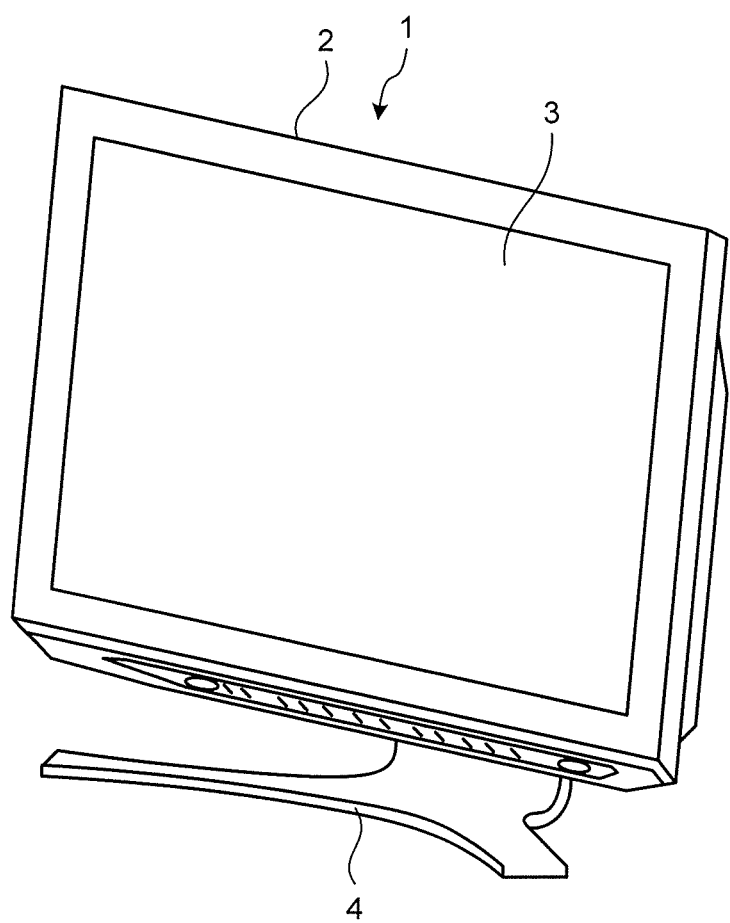
FIG. 1 is an exemplary external perspective view of a digital television according to an embodiment.

FIG. 1 is an external perspective view of an example of a digital television 1 that is a video display device according to an embodiment. As illustrated in FIG. 1, the digital television 1 externally has a rectangular shape when viewed from the front (or in a plan view of the front face). The digital television 1 comprises a housing 2 and a liquid crystal display (LCD) panel 3. The LCD panel 3 receives a video signal from a later described video processor 20 (see FIG. 2), and displays an image such as a still image or a video image. The housing 2 is supported by a supporting portion 4.

Figure 2:
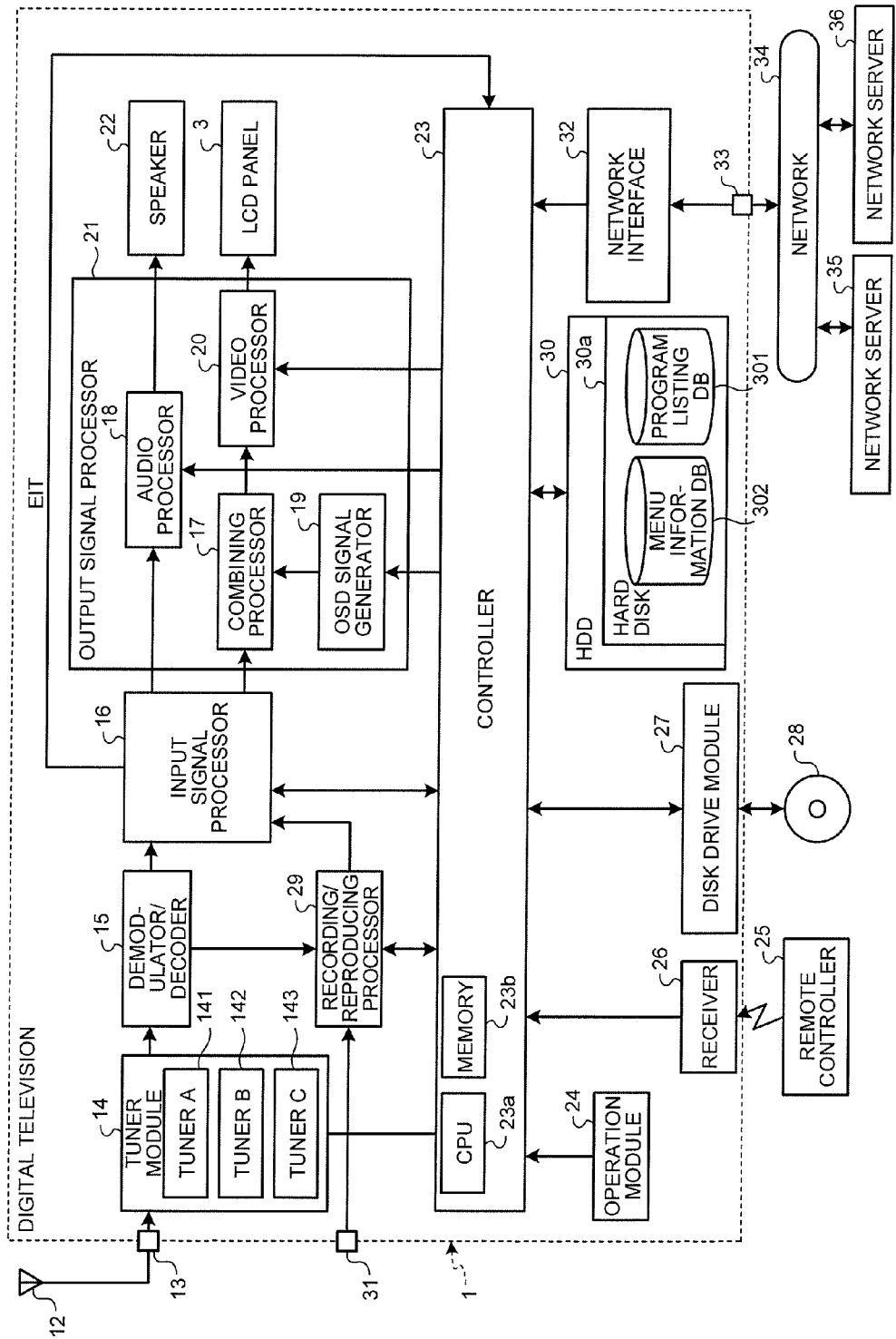
FIG. 2 is an exemplary block diagram of the signal processing system of the digital television in the embodiment.

FIG. 2 is a block diagram of the signal processing system of the digital television 1. As illustrated in FIG. 2, the digital television 1 supplies digital television broadcast signals received by an antenna 12 to a tuner module 14 as a receiver via an input terminal 13 so that the broadcast signal of a desired channel can be selected. The digital television 1 supplies the broadcast signal selected by the tuner module 14 to a demodulator/decoder 15 to recover the digital video and audio signals and the like. The recovered signals are then output to an input signal processor 16. It should be noted that the digital television 1 of this embodiment described herein comprises three tuners serving as receivers that receive digital television broadcast signals (two of the three tuners being a tuner A 141 and a tuner B 142 for receiving terrestrial digital broadcasts, the other one being a tuner C 143 for receiving BS/CS digital broadcasts).

The input signal processor 16 performs predetermined digital signal processing on each of the digital video and audio signals supplied from the demodulator/decoder 15.

The input signal processor 16 separates an event information table (EIT) from the broadcast signals selected by the tuner module 14. This table describes the event information such as the names of programs, the cast, and the start times. The EIT separated by the input signal processor 16 is input as program listing data to a controller 23. The EIT contains the information about programs such as the title information as the event information about the programs, and the information about the broadcast content such as the genre information, the air dates, and the cast information.

The input signal processor 16 outputs digital video signals to a combining processor 17, and outputs digital audio signals to an audio processor 18. The combining processor 17 superimposes on-screen display (OSD) signals on the digital video signals supplied from the input signal processor 16, and outputs the superimposed signals. The OSD signals are video signals to be superimposed, such as subtitles, graphical user interfaces (GUIs), and OSDs generated from an OSD signal generator 19. In this case, the combining processor 17 superimposes OSD signals supplied from the OSD signal generator 19 directly on the video signals supplied from the input signal processor 16, and outputs the superimposed signals.

The digital television 1 supplies the digital video signals output from the combining processor 17 to the video processor 20. The video processor 20 converts the input digital video signals into analog video signals in a format that can be displayed on the LCD panel 3 functioning as an output module. The digital television 1 supplies the analog video signals output from the video processor 20 to the LCD panel 3 so that the analog video signals are used in video image outputs.

The audio processor 18 converts the input digital audio signals into analog audio signals in a format that can be reproduced by a speaker 22 in a later stage. The analog audio signals output from the audio processor 18 are supplied to the speaker 22, and are used for audio reproductions.

As illustrated in FIG. 2, the above described combining processor 17, the audio processor 18, the OSD signal generator 19, and the video processor 20 constitute an output signal processor 21.

In the digital television 1, the controller 23 collectively controls all operations including the above described various receiving operations. The controller 23 contains a central processing unit (CPU) 23*a*. The controller 23 receives operation information from an operation module 24 that is an operating device mounted in the main unit of the digital television 1, or receives operation information transmitted from a remote controller 25 serving as an operating device to a receiver 26. The controller 23 controls the respective modules so that the contents of the operations are reflected.

The controller 23 also contains a memory 23*b*. The memory 23*b* comprises a read only memory (ROM) storing the control program to be executed by the CPU 23*a*, a random access memory (RAM) for providing a work area to the CPU 23*a*, and a nonvolatile memory that stores various kinds of setting information, control information, and the operation information supplied from the operation module 24 and the remote controller 25, and the like.

A disk drive module 27 is also connected to the controller 23. An optical disk 28 such as a digital versatile disk (DVD) can be set in and detached from the disk drive module 27. The disk drive module 27 has the function to perform recording and reproducing of digital data on the set optical disk 28.

In accordance with an operation of the operation module 24 or the remote controller 25 by a viewer, the controller 23 can control a recording/reproducing processor 29 to transform the digital video signals and audio signals obtained from the demodulator/decoder 15 into a predetermined recording format by encrypting the digital video signals and audio signals. The controller 23 then supplies the transformed signals to the disk drive module 27, and can control the disk drive module 27 to record the transformed signals on the optical disk 28.

In accordance with an operation of the operation module 24 or the remote controller 25 by a viewer, the controller 23 can also control the disk drive module 27 to read the digital video signals and audio signals from the optical disk 28, and control the recording/reproducing processor 29 to decrypt the read signals. The decrypted signals are then supplied to the input signal processor 16, and thereafter, are used in the above described video image displaying and audio reproductions.

A hard disk drive (HDD) 30 is connected to the controller 23. In accordance with an operation of the operation module 24 or the remote controller 25 by a viewer, the controller 23 can control the recording/reproducing processor 29 to transform the digital video signals and audio signals obtained from the demodulator/decoder 15 into a predetermined recording format by encrypting the digital video signals and audio signals. The controller 23 can then supply the transformed signals to the HDD 30, and control the HDD 30 to record the transformed signals on a hard disk 30*a*.

In accordance with an operation of the operation module 24 or the remote controller 25 by a viewer, the controller 23 can also control the HDD 30 to read the digital video signals and audio signals from the hard disk 30*a*, and control the recording/reproducing processor 29 to decrypt the read signals. The decrypted signals are then supplied to the input signal processor 16, and thereafter, are used in the above described video image displaying and audio reproductions.

The HDD 30 stores various kinds of data into the hard disk 30*a*, so as to function as a program listing database (program listing DB) 301 and a menu information database (menu information DB) 302. Under the control of the controller 23, the program listing database 301 stores program listing data in the form of the EIT separated by the input signal processor 16. The menu information database 302 stores menu configuration information for configuring a menu screen associated with later described various functions of the digital television 1.

An input terminal 31 is further connected to the digital television 1. The input terminal 31 is used to input digital video signals and audio signals from the outside directly into the digital television 1. Under the control of the controller 23, the digital video signals and audio signals input via the input terminal 31 are supplied to the input signal processor 16 via the recording/reproducing processor 29, and thereafter, are used in the above described video image displaying and audio reproductions.

Under the control of the controller 23, the digital video signals and audio signals input via the input terminal 31 are supplied to the recording/reproducing processor 29, and are then used in recording and reproducing performed on the optical disk 28 by the disk drive module 27, and recording and reproducing performed on the hard disk 30a by the HDD 30.

It should be noted that, in accordance with an operation of the operation module 24 or the remote controller 25 by a viewer, the controller 23 also controls recording between the disk drive module 27 and the HDD 30. Specifically, the controller 23 also controls recording of the digital video signals and audio signals recorded on the optical disk 28 onto the hard disk 30a, and controls recording of the digital video signals and audio signals recorded on the hard disk 30a onto the optical disk 28.

A network interface 32 is also connected to the controller 23. The network interface 32 is connected to an external network 34 via an input/output terminal 33. Network servers 35, 36 for providing various services by using the communication functions obtained through the network 34 are connected to the network 34. With this arrangement, the controller 23 can use the services being provided therein by accessing and exchanging information with a desired one of the network servers 35, 36 via the network interface 32, the input/output terminal 33, and the network 34. It should be noted that a SD memory card or a USB device may be connected to the network interface 32 via the input/output terminal 33.

Figure 3:
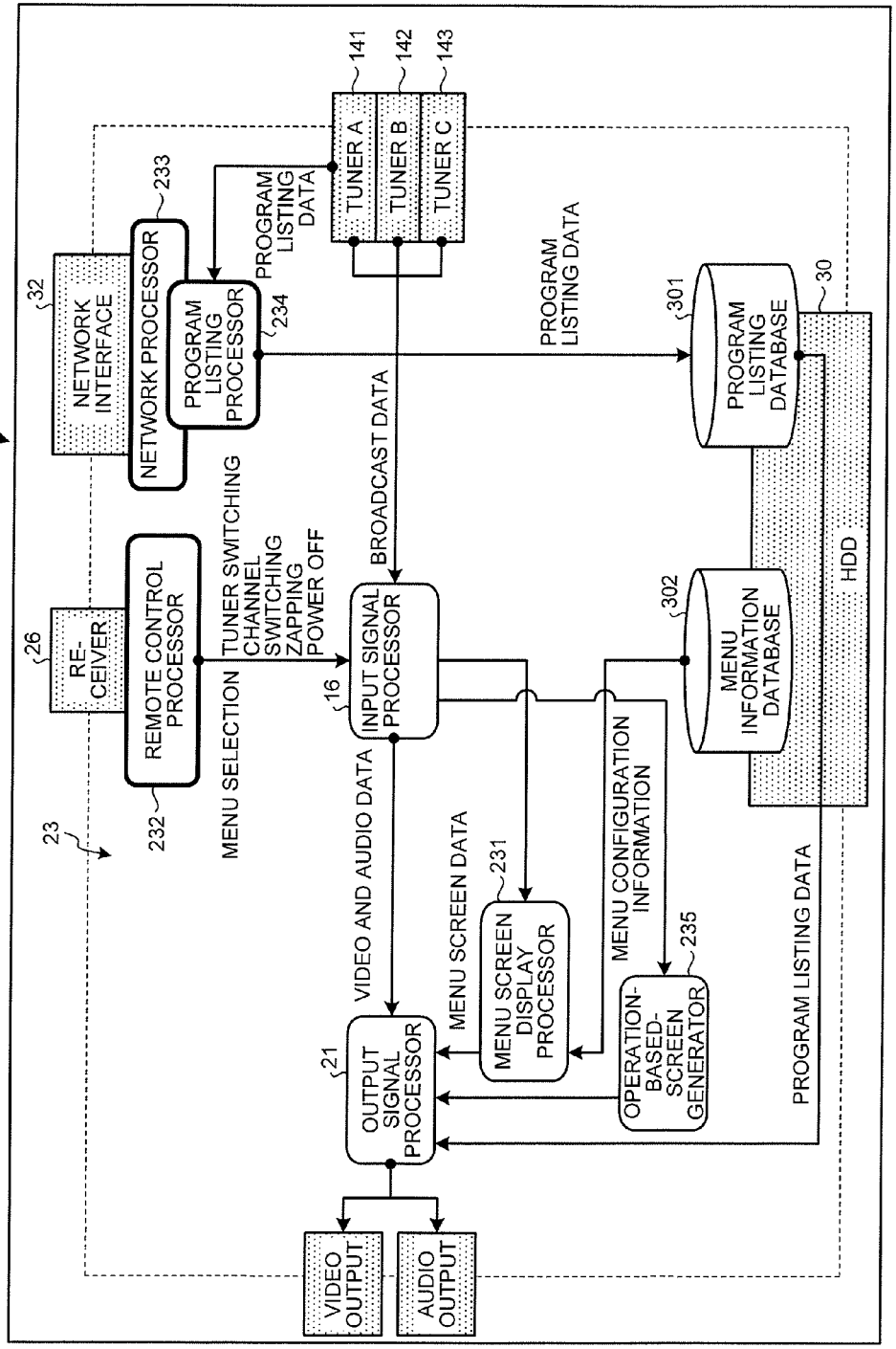
FIG. 3 is an exemplary functional block diagram of the controller in the embodiment.

As the CPU 23a operates in accordance with the control program, the controller 23 realizes a menu screen display processor 231 functioning as a menu screen display module, a remote control processor 232, a network processor 233, a program listing processor 234, and an operation-based-screen generator 235 functioning as a screen generator, as illustrated in FIG. 3.

The network processor 233 controls communications performed through the network interface 32 connected to the external network 34 via the input/output terminal 33. The network servers 35 and 36 (the number of the network servers is two in the example illustrated in the drawings) for providing various services by using the communication functions obtained via the network 34 are connected to the network 34. With this arrangement, the network processor 233 can use the services being provided therein by accessing and exchanging information with a desired one of the network servers 35, 36 via the network interface 32, the input/output terminal 33, and the network 34.

The program listing processor 234 obtains the EIT (the program listing data) separated by the input signal processor 16, and stores the EIT into the program listing database 301. It should be noted that the EIT (the program listing data) may be obtained through the network 34. Where the EIT (the program listing data) is obtained from is determined by the user setting in the digital television 1. The program listing processor 234 has a keyword search function for the EIT (the program listing data). The program listing processor 234 searches for the EIT (the program listing data) with a designated keyword and a predetermined concordance rate. The program listing processor 234 then narrows down a matched program, and supplies the corresponding program listing data to the program listing database 301.

Based on a remote control code that is transmitted from the remote controller 25 and is received by the receiver 26, the remote control processor 232 instructs the input signal processor 16 to switch on or off the power supply, select a menu in a later described manner, switch tuners, or switch channels (including a so-called zapping operation in which channels are repeatedly switched). When receiving operation information from the operation module 24 installed in the main unit of the digital television 1, the controller 23 also controls the respective modules so that the contents of the operation are reflected.

For example, in accordance with an operation of the operation module 24 or the remote controller 25 by a viewer, the controller 23 can control the recording/reproducing processor 29 to transform the digital video signals and audio signals obtained from the demodulator/decoder 15 into a predetermined recording format by encrypting the digital video signals and audio signals. The controller 23 can then supply the transformed signals to the HDD 30, and control the HDD 30 to record the transformed signals on the hard disk 30a.

Based on a remote control code (the motion signal corresponding to the selected menu) that is transmitted from the remote controller 25 and is received by the receiver 26, the menu screen display processor 231 obtains the menu configuration information from the menu information database 302. The menu screen display processor 231 then creates menu screen data that is a graphical user interface (GUI), and sends the menu screen data to the OSD signal generator 19.

When a "program" in a program listing X (see FIG. 11) is selected in a situation where the program listing X created from the program listing data stored in the program listing database 301 is displayed, for example, the operation-based-screen generator 235 generates an operation-based-screen Y (see FIGS. 13 to 16) corresponding to the "program", and sends the operation-based-screen Y to the OSD signal generator 19.

That is, the output signal processor 21 combines the video and audio data sent from the input signal processor 16, the menu screen data created by the menu screen display processor 231, the operation-based-screen Y generated from the operation-based-screen generator 235, and the audio data. The output signal processor 21 then sends the respective data to the video output and the audio output.

Figure 4:
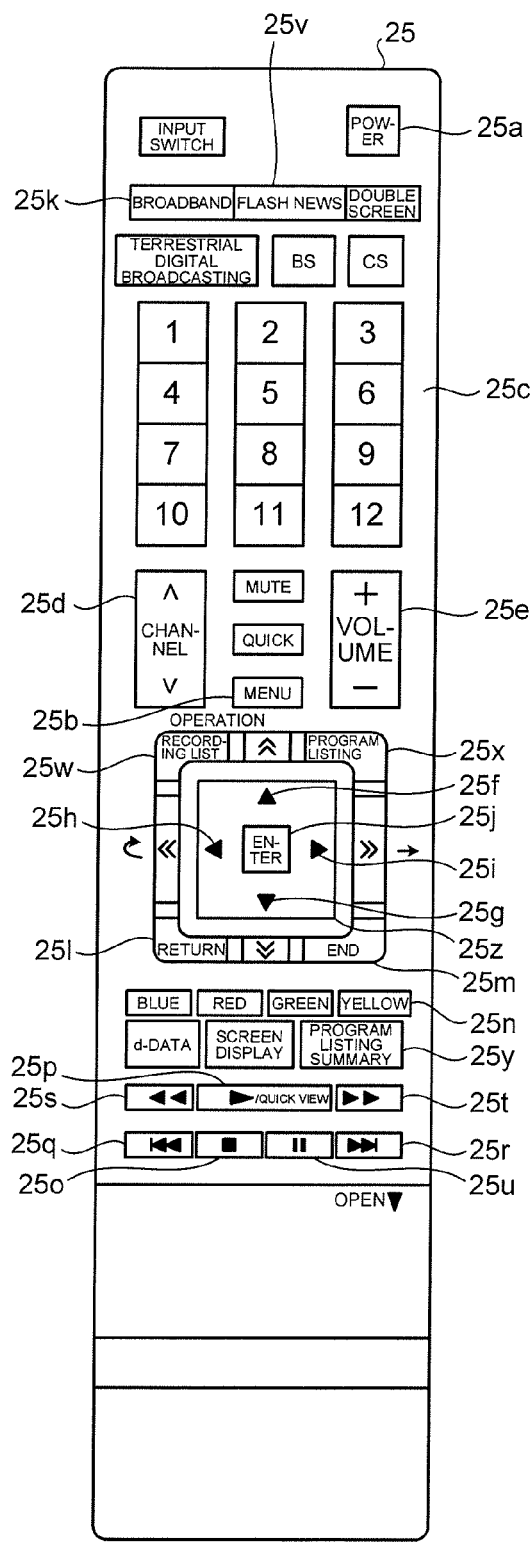
FIG. 4 is an exemplary plan view of the exterior of a remote controller in the embodiment.

FIG. 4 is a plan view showing the exterior of the remote controller 25. As illustrated in FIG. 4, the remote controller 25 comprises a power key 25a, numeric keys 25c, a channel selecting key 25d, a volume control key 25e, a cursor-up key 25f, a cursor-down key 25g, a cursor-left key 25h, a cursor-right key 25i, an enter key 25j, a return key 25l, an end key 25m, and four color (blue, red, green, and yellow) keys 25n. The cursor-up key 25f, the cursor-down key 25g, the cursor-left key 25h, and the cursor-right key 25i are formed as a so-called arrow key 25z.

The remote controller 25 also comprises a play stop key 25o, a play key 25p, a backward skip key 25q, a forward skip key 25r, a fast-rewind key 25s, a fast-forward key 25t, and a pause key 25u.

That is, in the digital television 1, information such as video images and sound obtained from the disk drive module 27 or the HDD 30 can be reproduced, stopped, or paused by operating the play stop key 25o, the play key 25p, or the pause key 25u of the remote controller 25. Also, in the digital television 1, information such as video images and sound being reproduced by the disk drive module 27 or the HDD 30 can be skipped by a constant amount in the backward or forward direction with respect to the reproducing direction, or can be backward-skipped or forward-skipped, by operating the backward skip key 25q or the forward skip key 25r of the remote controller 25. Further, in the digital television 1, information such as video images or sound being reproduced by the disk drive module 27 or the HDD 30 can be continuously reproduced at a high speed in the backward or forward direction with respect to the reproducing direction, or can be fast-rewound or fast-forwarded, by operating the fast-rewind key 25s or the fast-forward key 25t of the remote controller 25.

The remote controller 25 also comprises a menu key 25b, a broadband key 25k, a flash news key 25v, a recording list key 25w, a program listing key 25x, and a program listing summary key 25y.

The menu key 25b is the key for displaying a menu screen showing various functions of the digital television 1, and will be described later in greater detail.

The broadband key 25k is the key for activating various browsers having broadband capabilities such as information searching and video providing services. The flash news key 25v is the key for viewing the latest news automatically recorded in the HDD 30. The recording list key 25w is the key for displaying a recording list designed for viewing or erasing programs recorded on the HDD 30. It should be noted that the video images stored in the network servers 35 and 36 can also be reproduced through the recording list.

The program listing key 25x is the key for displaying the program listing X designed for viewing programs, recording programs, and scheduling the recording of programs. The program listing summary key 25y is the key for displaying a program listing summary in the lower portion of the screen on which programs are displayed. The program listing summary is designed for viewing programs, recording programs, and scheduling the recording of programs.

Next, a menu screen display process to be performed by the menu screen display processor 231 having functions characteristic of the digital television 1 as a video display device is described in detail.

Figure 5:
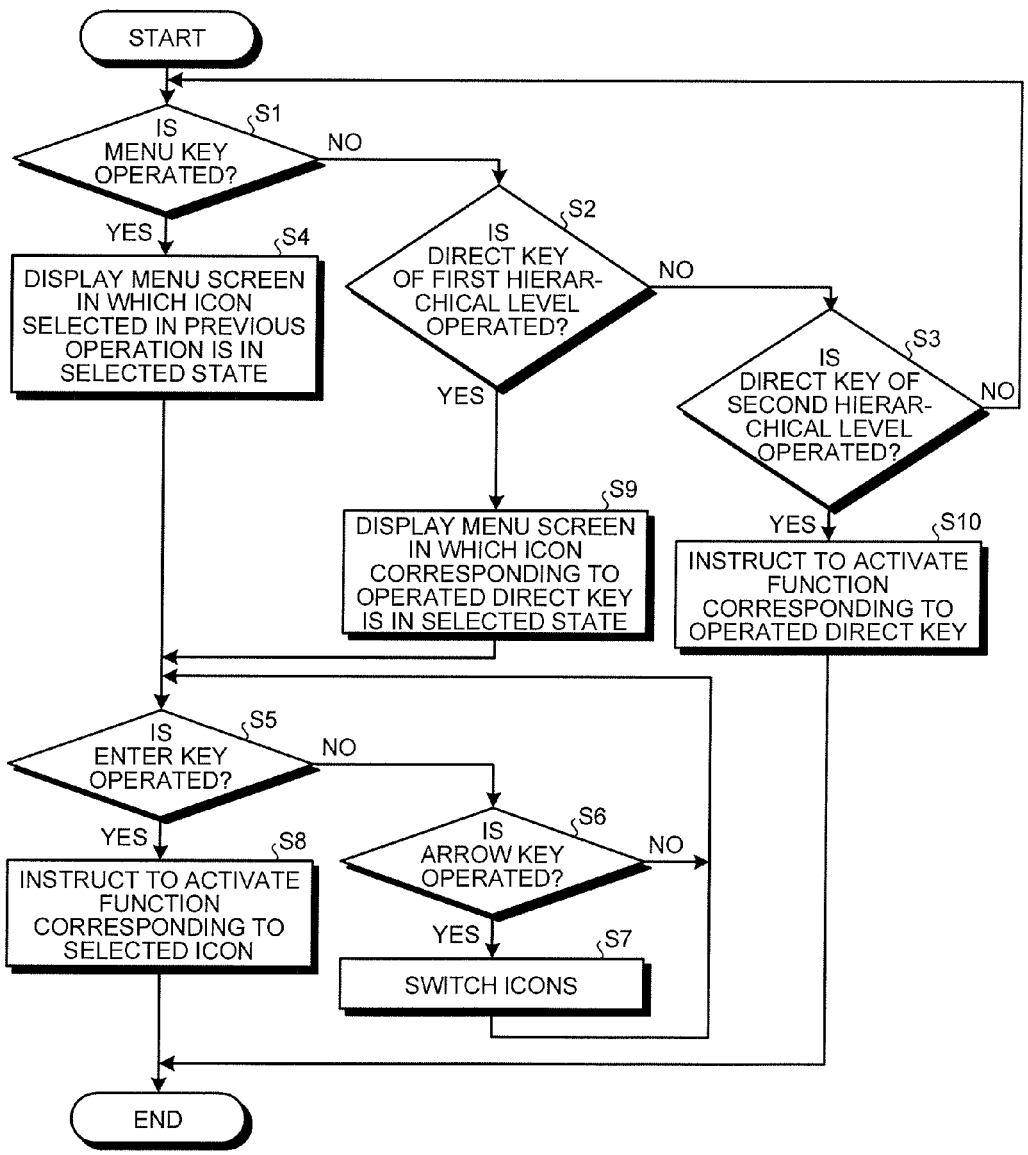
FIG. 5 is an exemplary flowchart of a menu screen display process in the embodiment.

Referring first to the flowchart in FIG. 5, the menu screen display process to be performed by the menu screen display processor 231 is described.

As shown in FIG. 5, when the controller 23 (the menu screen display processor 231) determines that there has been a selecting operation of the menu key 25b of the remote controller 25 by a user (Yes in S1), the controller 23 generates menu screen display information for displaying a menu screen, based on the menu configuration information. The controller 23 then outputs the menu screen display information to the output signal processor 21. In turn, the output signal processor 21 outputs the menu screen display information to the LCD panel 3. As a result, the LCD panel 3 displays the menu screen M1 illustrated in FIG. 6 (S4).

The menu screen M1 is superimposed on a reproduced screen C of content (such as a video image). The content may be content received via the tuner module 14, or may be content stored in the HDD 30.

Figure 6:
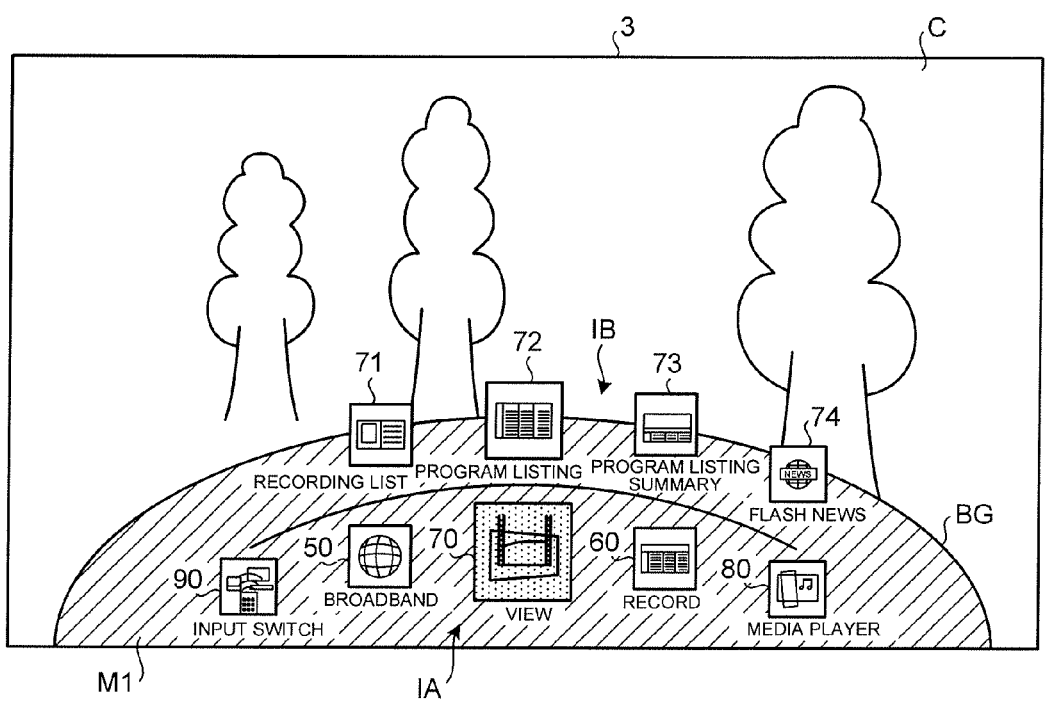
FIG. 6 is an exemplary front view of a menu screen in the embodiment.

As illustrated in FIG. 6, the menu screen M1 comprises: a menu classification icon group (first group, classification select element group) IA formed by icons (select elements) representing menu classifications, and arranged at a lower portion of the reproduced screen C of the contents, the icons representing the menu classifications being at a higher hierarchical level (the first hierarchical level) displayed in various sizes; and menu icon groups (second group, function select element group) IB formed by icons (select elements) representing functions corresponding to each of the menu classifications, the menu icon groups being at a lower hierarchical level (second hierarchical level). In the menu screen M1, the background BG of the menu classification icon group IA and the menu icon group IB in a dark color, so that the icons can be easily distinguished from the reproduced screen C of the content. It should be noted that the select elements are not necessarily icons, but may be some other images or characters, as long as those images or characters represent the menu classifications and the functions corresponding to the respective menu classifications.

FIG. 7 shows the relationships between the menu classification icon group IA of the higher hierarchical level (the first hierarchical level) and the menu icon group IB of the lower hierarchical level (the second hierarchical level).

The menu classification icon group IA comprises a "broadband" icon 50, a "record" icon 60, a "view" icon 70, a "media player" icon 80, and an "input switch" icon 90.

The "broadband" icon 50 is the shortcut icon representing the menu classification for activating the network applications (browsers) corresponding to network services, for example.

The "record" icon 60 is the shortcut icon representing the menu classification for recording content or scheduling the recording of content.

The "view" icon 70 is the shortcut icon representing the menu classification for viewing content.

The "media player" icon 80 is the shortcut icon representing the menu classification for activating the reproduction applications corresponding to reproductions of video images, photographs, and music stored in SD memory cards, USB devices, the network servers 35 and 36, and the like.

The "input switch" icon 90 is the shortcut icon representing the menu classification for switching the input terminal 31.

In the menu classification icon group IA illustrated in FIG. 6, the "view" icon 70 selected in the previous operation is still in a selected state, and the "view" icon 70 in the selected state is enlarged from a first size, and is emphasized by a brightened background, for example. Meanwhile, the "broadband" icon 50 that is located on the left side of the icon in the selected state and is a second candidate for selection (in a nonselected state) is displayed in a second size smaller than the first size, and the "record" icon 60 that is located on the right side of the icon in the selected state and is another second candidate for selection (in a nonselected state) is also displayed in the second size smaller than the first size. The "media player" icon 80 that is located on the right side of one of the second-candidate icons and is a third candidate for selection (in a nonselected state) is displayed in a third size even smaller than the second size, and the "input switch" icon 90 that is located on the left side of the other second-candidate icon and is another third candidate for selection (in a nonselected state) is also displayed in the third size even smaller than the second size. It should be noted that the reason that the icon selected in the previous operation is still in the selected state is that there is a high probability that the user will repeat the same operation. With this arrangement, the user can readily select a desired selective function from various kinds of functions through a simple operation. As described above, the operation information from the operation module 24 and the remote controller 25 is stored in a nonvolatile memory.

The menu icon group IB illustrated in FIG. 6 is an example of when the "view" icon 70 is selected from the menu classification icon group IA. While the "view" icon 70 is in a selected state, the menu icon group IB includes a "recording list" icon 71, a "program listing" icon 72, a "program listing summary" icon 73, and a "flash news" icon 74.

The "recording list" icon 71 is the icon for displaying the recording list for viewing or erasing programs recorded on the HDD 30, and has the same functions as those of the recording list key 25w.

The "program listing" icon 72 is the icon for displaying the program listing X to view programs, record programs, and scheduling the recording of programs, and has the same functions as those of the program listing key 25x.

The "program listing summary" icon 73 is the icon for displaying the program listing summary in the lower portion of the reproduced screen C of content, and has the same functions as those of the program listing summary key 25y. The program listing summary is designed for viewing programs, recording programs, and scheduling the recording of programs.

The "flash news" icon 74 is the icon for viewing the latest news automatically recorded in the HDD 30, and has the same functions as those of the news key 25v.

In the menu icon group IB illustrated in FIG. 6, the "program listing" icon 72 selected in the previous operation is displayed in a first size, for example. Meanwhile, the "program listing summary" icon 73 that is located on the right side of the icon previously selected and is a second candidate for selection (in a nonselected state) is displayed in a second size smaller than the first size, and the "recording list" icon 71 that is located on the left side of the icon previously selected and is another second candidate for selection (in a nonselected state) is also displayed in the second size smaller than the first size. The "flash news" icon 74 that is located on the right side of one of the second-candidate icons and is a third candidate for selection (in a nonselected state) is displayed in a third size even smaller than the second size.

In the menu screen M1 illustrated in FIG. 6, when the cursor-left key 25h or the cursor-right key 25i of the arrow key 25z of the remote controller 25 is operated (No in S5 and Yes in S6), the icon target can be switched to another icon in the menu classification icon group IA (S7). Specifically, the remote controller 25 outputs a motion signal (a remote control code) corresponding to an operation (a menu selection) of the arrow key 25z. The remote control processor 232 receives the motion signal, and the menu screen display processor 231 controls the switching of the icon target, based on the motion signal.

Figure 8:
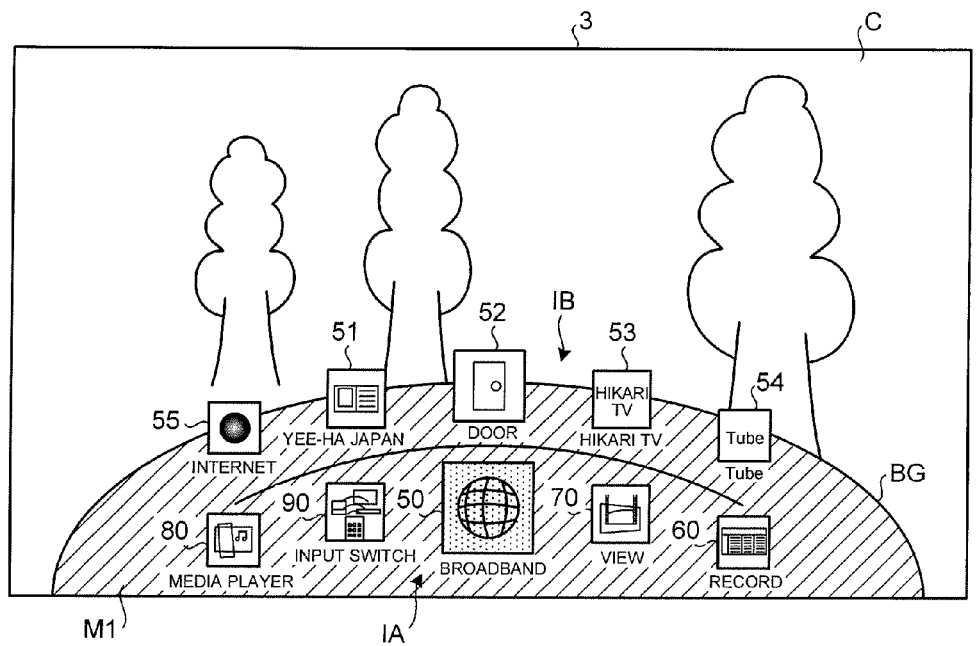
FIG. 8 is another exemplary front view of the menu screen in the embodiment.

FIG. 8 illustrates a situation where the target is switched from the "view" icon 70 illustrated in FIG. 6 to the "broadband" icon 50 by operating the cursor-left key 25h of the arrow key 25z of the remote controller 25. As illustrated in FIG. 8, the newly selected "broadband" icon 50 is further enlarged from the first size, and is emphasized by a brightened background.

Also, as illustrated in FIG. 8, while the "broadband" icon 50 is in a selected state in the menu classification icon group IA, the menu icon group IB includes a "Yee-ha JAPAN" icon 51, a "Door" icon 52, a "Hikari TV" icon 53, a "Tube" icon 54, and an "Internet" icon 55. Although seven menu items are associated with the "broadband" icon 50, the menu screen display processor 231 cyclically displays the seven menu items within the display frame number ("5" in this example) of the menu icon group IB.

Also, in the menu screen M1 illustrated in FIG. 6, when the cursor-up key 25f of the arrow key 25z of the remote controller 25 is operated (No in S5 and Yes in S6), the icon target can be switched from an icon in the menu classification icon group IA to an icon in the menu icon group IB (S7).

Figure 9:
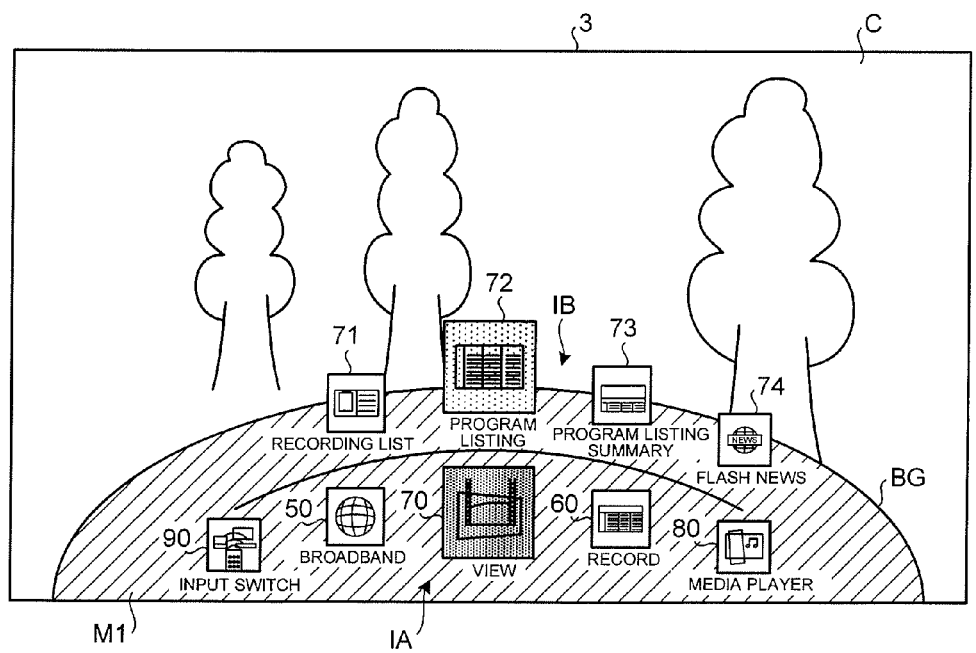
FIG. 9 is still another exemplary front view of the menu screen in the embodiment.

FIG. 9 illustrates a situation where the target is switched from the "view" icon 70 illustrated in FIG. 6 to the "program listing" icon 72 of the menu icon group IB by operating the cursor-up key 25f of the arrow key 25z of the remote controller 25. As illustrated in FIG. 9, the newly selected "program listing" icon 72 is further enlarged from the first size, and is emphasized by a brightened background. Meanwhile, the "view" icon 70 is reduced to the first size, and its background is slightly brightened.

Further, in response to a user's selecting operation of a direct key of the first hierarchical level that is the broadband key 25k of the remote controller 25 (Yes in S2), the controller 23 (the menu screen display processor 231) generates the menu screen display information for displaying a menu screen, based on the menu configuration information, and outputs the menu screen display information to the output signal processor 21 (S9). In this case, the broadband key 25k is the key for activating various browsers having broadband capabilities such as information searching and video providing services, and represents the specific functions of the first hierarchical level illustrated in FIG. 7. That is, through a selecting operation of the broadband key 25k of the remote controller 25, the controller 23 (the menu screen display processor 231) generates the menu screen display information for displaying the menu screen M1 illustrated in FIG. 8. In the menu screen M1 displayed through the selecting operation of the broadband key 25k, the "broadband" icon 50 is further enlarged from the first size, and is emphasized by a brightened background, as illustrated in FIG. 8.

Figure 10:
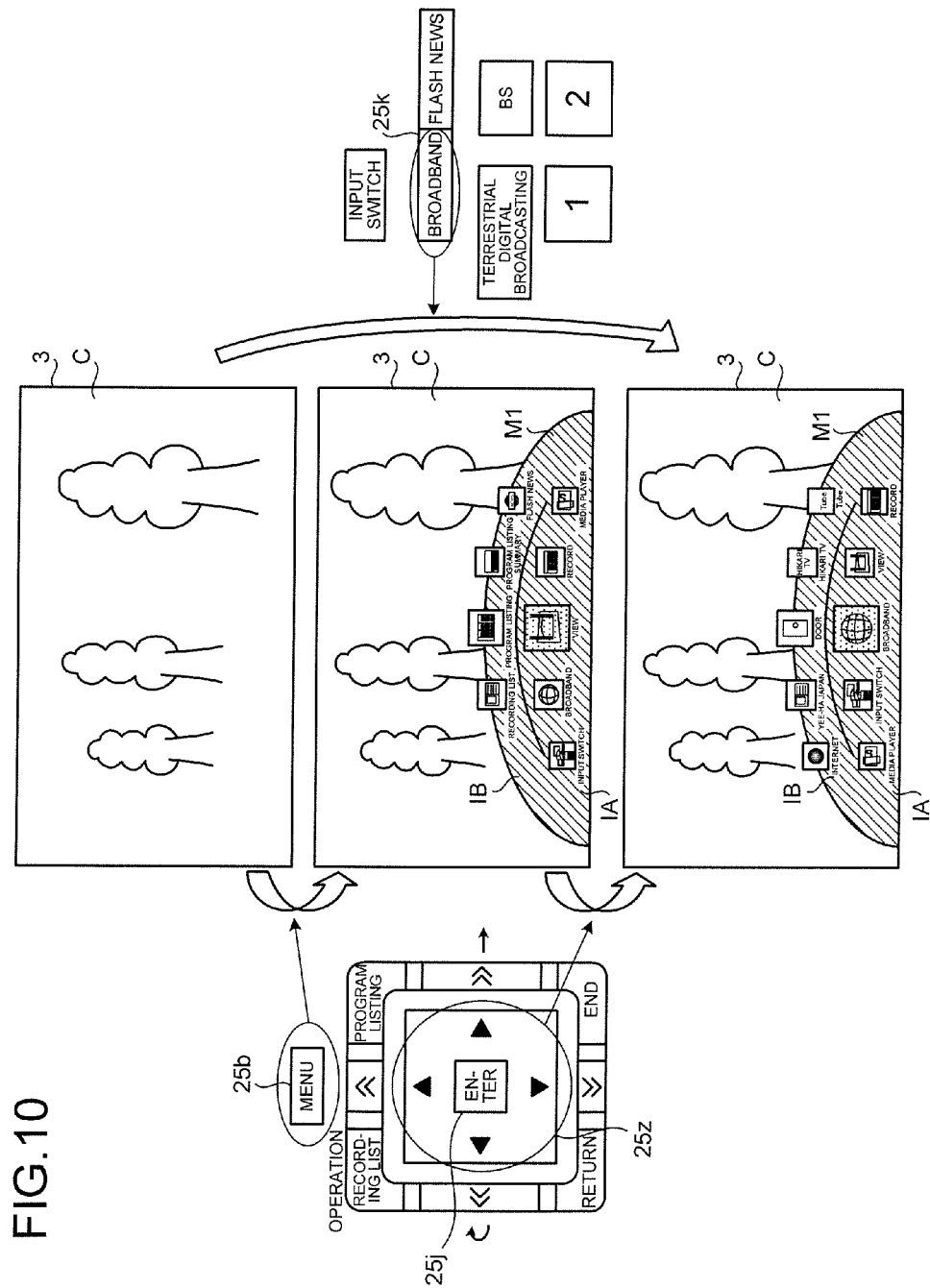
FIG. 10 is an exemplary schematic diagram illustrating a transition in the embodiment.

FIG. 10 is a schematic diagram illustrating an example of a transition to a specific function of the first hierarchical level by operating the menu key 25b and the arrow key 25z, and a transition to a specific function of the first hierarchical level by operating a direct key.

In the menu screen M1 in which a menu icon of the second hierarchical level is in a selected state as illustrated in FIG. 9, when the enter key 25j of the remote controller 25 is operated (Yes in S5), an instruction is issued to activate the function of the targeted icon (S8). In FIG. 9, the "program listing" icon 72 is targeted. Therefore, the output signal processor 21 displays the program listing X on the LCD panel 3, based on the program listing data stored in the program listing database 301.

In the menu screen M1 in which a menu icon of the second hierarchical level is in a selected state as illustrated in FIG. 9, when a menu classification of the menu classification icon group IA of the first hierarchical level is to be selected, the cursor-down key 25g of the arrow key 25z of the remote controller 25 should be operated (Yes in S6).

Further, in response to a user's selecting operation of a direct key of the second hierarchical level such as the flash news key 25v, the recording list key 25w, the program listing key 25x, or the program listing summary key 25y of the remote controller 25 (Yes in S3), the controller 23 issues an instruction to activate a function corresponding to each key (S10). In this case, the flash news key 25v, the recording list key 25w, the program listing key 25x, and the program listing summary key 25y are the keys for issuing instructions for activating the functions corresponding to the respective keys, and represent the specific functions of the second hierarchical level illustrated in FIG. 7. For example, through a selecting operation of the program listing key 25x of the remote controller 25, the output signal processor 21 displays the program listing X on the LCD panel 3, based on the program listing data stored in the program listing database 301.

Figure 11:
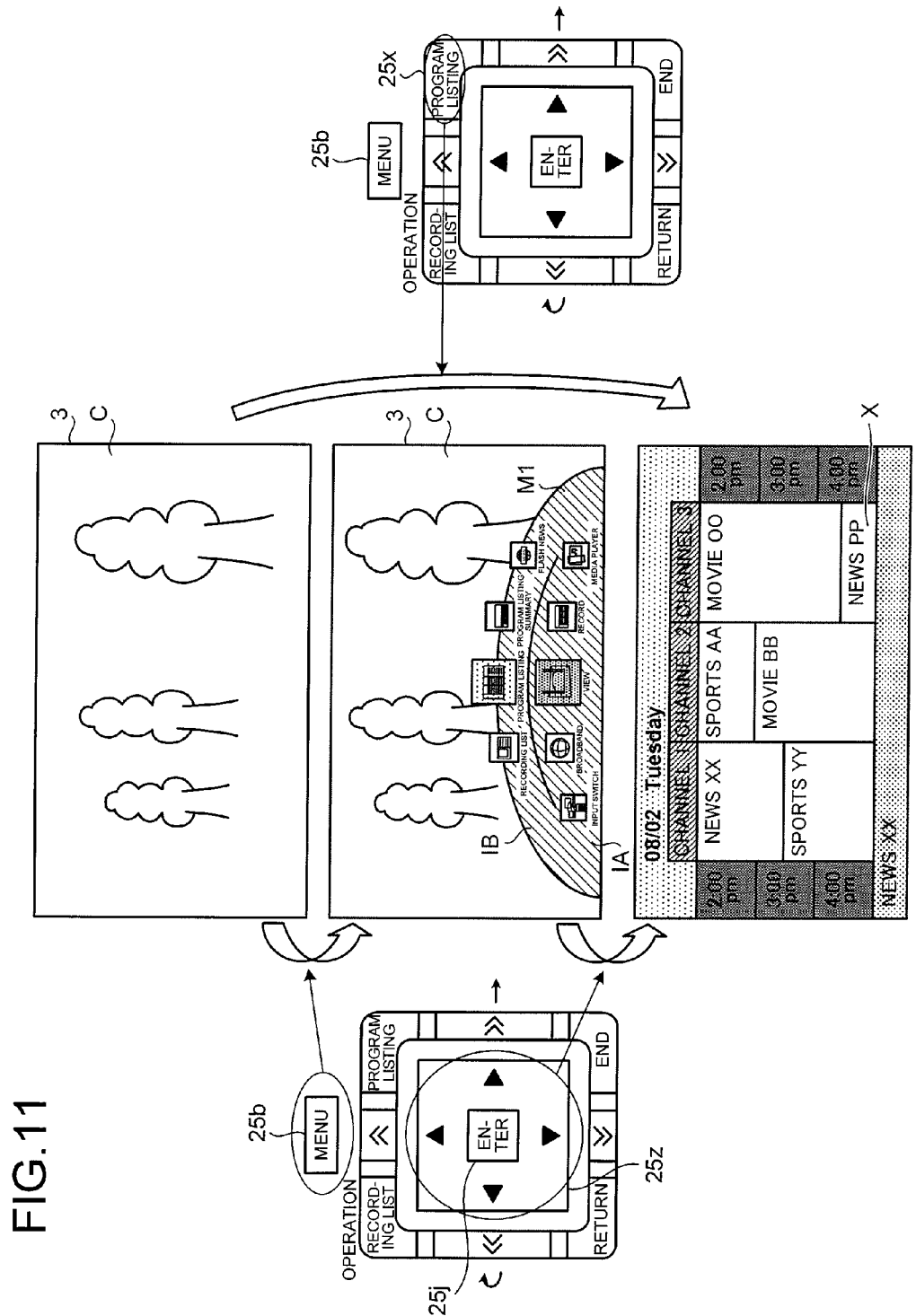
FIG. 11 is an exemplary schematic diagram illustrating another transition in the embodiment.

FIG. 11 is a schematic diagram illustrating an example of a transition to a specific function of the second hierarchical level by operating the menu key 25b and the arrow key 25z, and a transition to a specific function of the second hierarchical level by operating a direct key.

As illustrated in FIG. 7, both the "record" menu classification and the "view" menu classification of the first hierarchical level contain the "program listing" menu item in the second hierarchical level. Therefore, in this embodiment, the operation-based-screen Y displayed after a program is selected from the program listing X varies in form between a case where the "program listing" menu item is selected through the "view" icon 70 and a case where the "program listing" menu item is selected through the "record" icon 60.

Figure 12:
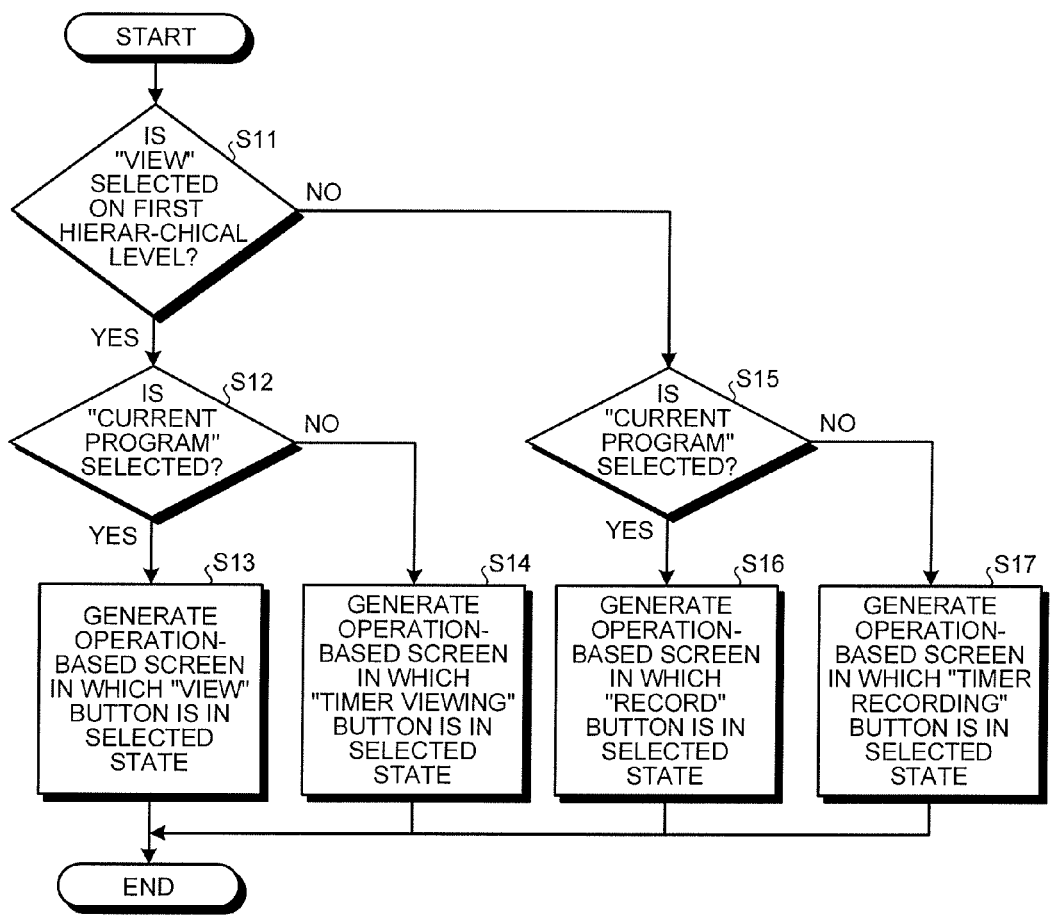
FIG. 12 is an exemplary flowchart of an operation-based-screen generating process in the embodiment.

Referring now to the flowchart illustrated in FIG. 12, an operation-based-screen generating process to be performed by the operation-based-screen generator 235 having functions characteristic of the digital television 1 as a video display device is described.

Figure 13:
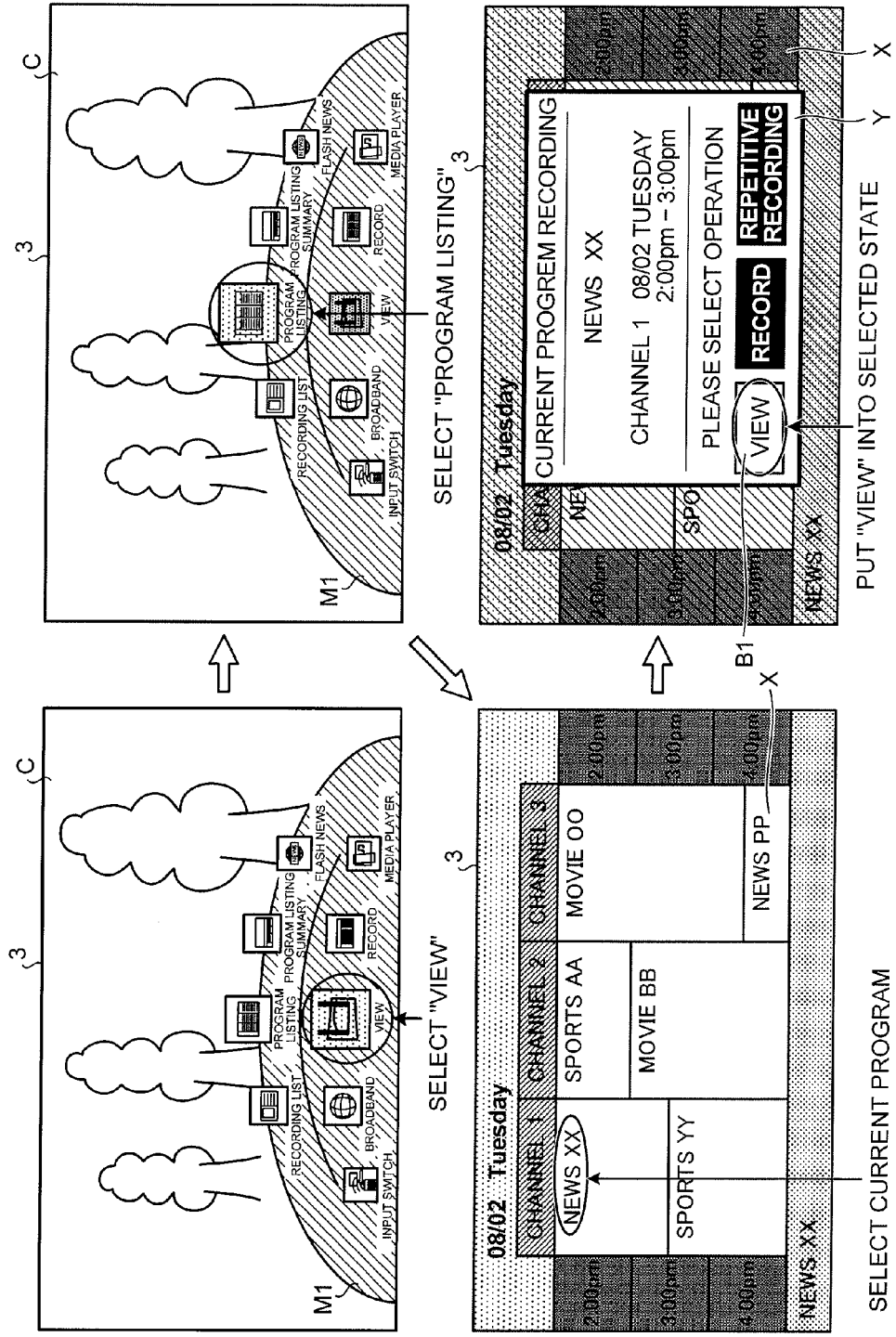
FIG. 13 is an exemplary schematic diagram illustrating still another transition in the embodiment.

As illustrated in FIG. 12, in a case where the program listing X in which the "program listing" menu item is selected through the "view" icon 70 is displayed (Yes in S11), when a "current program" is selected (Yes in S12), the operation-based-screen generator 235 generates the operation-based-screen Y in which a "view" button B1 is in a selected state as illustrated in FIG. 13 (S13), and outputs the operation-based-screen Y to the output signal processor 21.

Figure 14:
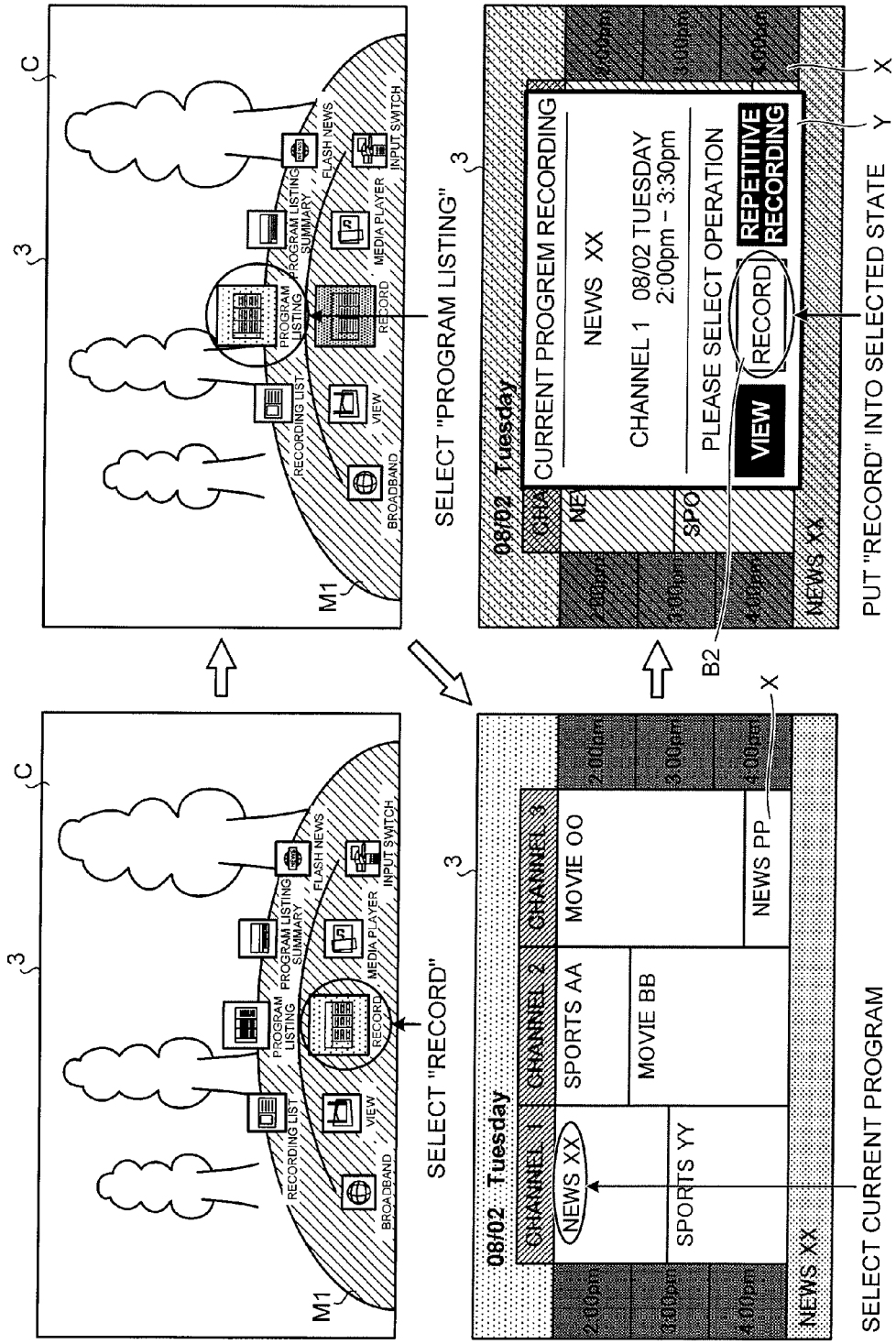
FIG. 14 is an exemplary schematic diagram illustrating still another transition in the embodiment.

In a case where the program listing X in which the "program listing" menu item is selected through the "record" icon 60 is displayed (No in S11), when the "current program" is selected (Yes in S15), the operation-based-screen generator 235 generates the operation-based-screen Y in which a "record" button B2 is selected as illustrated in FIG. 14 (S16), and outputs the operation-based-screen Y to the output signal processor 21.

In a case where the program listing X in which the "program listing" menu item is selected through the "view" icon 70 is displayed (Yes in S11), when a "future program" is selected (No in S12), the operation-based-screen generator 235 generates the operation-based-screen Y in which a "timer viewing" button B3 is in a selected state as illustrated in FIG. 15 (S14), and outputs the operation-based-screen Y to the output signal processor 21.

In a case where the program listing X in which the "program listing" menu item is selected through the "record" icon 60 is displayed (No in S11), when the "future program" is selected (No in S15), the operation-based-screen generator 235 generates the operation-based-screen Y in which a "timer recording" button B4 is selected as illustrated in FIG. 16 (S17), and outputs the operation-based-screen Y to the output signal processor 21.

In the digital television 1 as a video display device according to the embodiment, a menu screen M1 from which an icon representing a function can be selected by the key operation of the operation device is displayed. The menu screen M1 comprises at least two hierarchical levels. The higher hierarchical level of the hierarchical levels comprises a classification icon group IA formed by arranging icons representing classifications of various functions related to video image displaying. The lower hierarchical level of the hierarchical levels comprises the icon group IB formed by arranging icons representing the functions corresponding to the classifications. Accordingly, a user interface function by which a user can easily select a desired function among various functions from the hierarchized menu screen M1 through a simple operation can be realized. When a signal is received from a direct key on the operation device associated with one of the function classifications represented by the icons of the higher hierarchical level, the menu screen M1 in which the icon representing the function classification associated with the direct key is selected is displayed, so as to realize a user interface function by which a user who is used to conventional operations with direct keys can easily select a desired function.

Also, in the digital television 1 as a video display device according to this embodiment, when a signal is received from a direct key on the operation device associated with one of the functions represented by the icons of the lower hierarchical level, an instruction is issued to activate the function associated with the direct key, so as to realize a user interface function by which a user who is used to conventional operations with direct keys can easily select a desired function.

Further, in the digital television 1 as a video display device according to this embodiment, the operation-based-screen Y is generated in accordance with different classifications. The operation-based-screen Y has different screen modes for same one of the functions activated through a transition from different icons in the classification icon group IA in the menu screen displayed by the menu screen display module, in accordance with different classifications.

It should be noted that the control program to be executed in the digital television 1 as a video display device according to this embodiment may be written in an installable or an executable file format, and may be recorded in a computer-readable recording medium such as a CD-ROM, a flexible disk (FD), a CD-R, or a DVD.

Further, the control program to be executed in the digital television 1 as a video display device according to this embodiment may be stored in a computer connected to a network such as the Internet, and may be downloaded via the network. Alternatively, the control program to be executed in the digital television 1 as a video display device according to this embodiment may be provided or distributed over a network such as the Internet.

The program to be executed in the digital television 1 as a video display device according to this embodiment has a module configuration comprising the above described respective modules (the menu screen display processor 231, the remote control processor 232, the network processor 233, the program listing processor 234, and the operation-based-screen generator 235). In the actual hardware, the CPU (the processor) reads and executes the control program from the above mentioned ROM, so that the above described respective modules are loaded into the main memory device, and the menu screen display processor 231, the remote control processor 232, the network processor 233, the program listing processor 234, and the operation-based-screen generator 235 are generated in the RAM.

In this embodiment, the digital television 1 has been described as an example of a video display device. However, a video display device according to this embodiment can be used in a HDD recorder, a tuner, a set-top box, or the like.

Moreover, the various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A video display device comprising:
   a processor;
   a menu screen display module controlled by the processor and configured to display a menu screen from which a select element representing a desired function can be selected by a key operation on an operation device, the menu screen comprising at least two hierarchical levels including (1) a higher hierarchical level of the hierarchical levels comprising a classification select element group formed by arranging select elements representing classifications of various functions, and (2) a lower hierarchical level of the hierarchical levels comprising a function select element group formed by arranging select elements representing the functions corresponding to the classifications;

a first screen generating module controlled by the processor and configured to generate, when a content-list-displaying function is selected of the function select element group in the lower hierarchical level corresponding to a first classification select element selected of the classification select element group in the higher hierarchical level and a content is selected from a content list displayed by the content-list-displaying function, an operation screen including a first button corresponding to the first classification select element placed in a first state when the first classification select element from the higher hierarchical level is selected in advance and a second button corresponding to a second classification select element placed in a second state different than the first state when the second classification select element from the higher hierarchical level is not selected; and a second screen generating module controlled by the processor and configured to generate, when the content-list-displaying function is selected of the function select element group in the lower hierarchical level corresponding to the second classification select element selected of the classification select element group in the higher hierarchical level and the content is selected from the content list displayed by the content-list-displaying function, the operation screen including the second button placed in the first state when the second classification select element selected from the higher hierarchical level is selected in advance and the first button placed in the second state when the first classification select element from the higher hierarchical level is not selected.

2. The video display device of claim 1, wherein, upon receipt of a signal from a direct key to which one of the functions represented by the select elements of the lower hierarchical level is assigned, the menu screen display module issues an instruction to activate the one of the functions assigned to the direct key, the operation device comprising the direct key.

3. The video display device of claim 1, wherein at least one of the first screen generating module or the second screen generating module is further configured to generate a screen for a function select element, the screen having different screen modes for each classification select element.

4. The video display device of claim 3, wherein at least one of the first screen module generating or the second screen generating module is further configured to differentiate the screen modes from each other by making a button corresponding to each of the different classifications in the first state.

5. The video display device of claim 1, wherein the menu screen display module is configured to display the menu screen in which one of the select elements representing one of the classifications selected in a previous operation is in the first state.

6. The video display device of claim 1, wherein the menu screen display module is configured to display the menu screen in which one of the select elements in the first state is made larger in size.

7. The video display device of claim 1, wherein the menu screen display module is configured to display the menu screen in which one of the select elements in the first state is emphasized.

8. The video display device of claim 1, wherein the menu screen display module is configured to display the menu screen in which a background of classification select element group and the function select element group is formed in a dark color.

9. A menu screen display method applied to a video display device, the menu screen display method comprising:

displaying a menu screen from which a select element representing a desired function can be selected by a key operation on an operation device, the menu screen comprising at least two hierarchical levels including (1) a higher hierarchical level of the hierarchical levels comprising a classification select element group formed by arranging select elements representing classifications of various functions related to video image displaying, and (2) a lower hierarchical level of the hierarchical levels comprising a function select element group formed by arranging select elements representing the functions corresponding to the classifications; and generating, by a first screen generating module, when a content-list-displaying function is selected of the function select element group in the lower hierarchical level corresponding to a first classification select element selected of the classification select element group in the higher hierarchical level and a content is selected from a content list displayed by the content-list-displaying function, an operation screen including a first button corresponding to the first classification select element placed in a first state when the first classification select element from the higher hierarchical level is selected in advance and a second button corresponding to a second classification select element placed in a second state different than the first state when the second classification select element from the higher hierarchical level is not selected; and generating, by a second screen generating module, when the content-list-displaying function is selected of the function select element group in the lower hierarchical level corresponding to the second classification select element selected of the classification select element group in the higher hierarchical level and the content is selected from the content list displayed by the content-list-displaying function, the operation screen including the second button placed in the first state when the second classification select element selected from the higher hierarchical level is selected in advance and the first button placed in the second state when the first classification select element from the higher hierarchical level is not selected.

10. A video display device comprising:

a controller; and a display electronically coupled to the controller, wherein the controller being configured to (i) display a menu screen from which a select element representing a desired function can be selected by a key operation on an operation device, the menu screen comprising at least two levels including (1) a first level comprising a classification select element group formed by arranging select elements representing classifications of various functions, and (2) a second level comprising a function select element group formed by arranging select elements representing the functions corresponding to the classifications, (ii) generate, when a content-list-displaying function is selected of the function select element group in the second level corresponding to a first classification select element selected of the classification select element group in the first level and a content is selected from a content list displayed by the content-list-displaying function, an operation screen including a first button corresponding to the first classification select element placed in a first state when the first classification select element from the first level is selected in advance and a second button corresponding to a second classification select element placed in a second state different than the first state when the second classification select element from the first level is not selected, and (iii) generate, when the content-list-displaying function is selected of the function select element group in the second level corresponding to the second classification select element selected of the classification select element group in the first level and the content is selected from the content list displayed by the content-list-displaying function, the operation screen including the second button placed in the first state when the second classification select element selected from the first level is selected in advance and the first button placed in the second state when the first classification select element from the first level is not selected.

11. The video display device of claim 10, wherein, upon receipt of a signal from a direct key to which one of the functions represented by the select elements of the second level is assigned, the menu screen display module issues an instruction to activate the one of the functions assigned to the direct key, the operation device comprising the direct key.

12. The video display device of claim 11, wherein at least one of the first screen generating module or the second screen generating module is further configured to generate a screen for a function select element, the screen having different screen modes for each classification select element.

13. The video display device of claim 12, wherein at least one of the first screen generating module or the second screen generating module is further configured to differentiate the screen modes from each other by making a button corresponding to each of the different classifications in the first state.

14. The video display device of claim 10, wherein the menu screen display module is configured to display the menu screen in which one of the select elements representing one of the classifications selected in a previous operation is in the first state.

15. The video display device of claim 10, wherein the menu screen display module is configured to display the menu screen in which one of the select elements in the first state is made larger in size.

16. The video display device of claim 10, wherein the menu screen display module is configured to display the menu screen in which one of the select elements in the first state is emphasized.

17. The video display device of claim 10, wherein the menu screen display module is configured to display the menu screen in which a background of classification select element group and the function select element group is formed in a dark color.

* * * * *